(12) United States Patent
Hwang

(10) Patent No.: US 8,159,005 B2
(45) Date of Patent: Apr. 17, 2012

(54) IMAGE SENSOR

(75) Inventor: Joon Hwang, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 136 days.

(21) Appl. No.: 12/566,833

(22) Filed: Sep. 25, 2009

(65) Prior Publication Data

US 2010/0078686 A1   Apr. 1, 2010

(30) Foreign Application Priority Data

Sep. 30, 2008  (KR) .................. 10-2008-0096097

(51) Int. Cl.
*H01L 27/148* (2006.01)
(52) U.S. Cl. ............. 257/225; 257/431; 257/E31.11
(58) Field of Classification Search .......... 257/225, 257/431, 432, 444, 458, 461, 462, E31.11, 257/E31.128
See application file for complete search history.

(56) References Cited

U.S. PATENT DOCUMENTS 4,737,833 A * 4/1988 Tabei .................. 257/440
2004/0000681 A1 * 1/2004 Shinohara et al. .......... 257/290

FOREIGN PATENT DOCUMENTS

| KR | 10-2005-0117674 A | 12/2005 |
| KR | 10-2006-0120260 A | 11/2006 |
| KR | 10-2010-0012641 A | 2/2010 |

* cited by examiner

*Primary Examiner* — Tucker Wright
(74) *Attorney, Agent, or Firm* — Saliwanchik, Lloyd & Eisenschenk

(57) ABSTRACT

An image sensor and manufacturing method thereof are provided. The image sensor can include a readout circuitry, an interconnection, a second interlayer dielectric, an image sensing device, a contact plug, and a sidewall dielectric. The contact plug can electrically connect the first conductive type layer to the interconnection through a via hole passing through the image sensing device. The sidewall dielectric can be disposed on a sidewall of the second conductive type layer within the via hole.

10 Claims, 8 Drawing Sheets

IMAGE SENSOR

CROSS-REFERENCE TO RELATED APPLICATION

This application claims the benefit under 35 U.S.C. §119 of Korean Patent Application No. 10-2008-0096097, filed on Sep. 30, 2008, which is hereby incorporated by reference in its entirety.

BACKGROUND

An image sensor is a semiconductor device that converts an optical image into an electric signal. Image sensors can be classified into charge coupled device (CCD) image sensors and complementary metal oxide semiconductor (CMOS) image sensors (CIS).

During the fabrication of image sensors, a photodiode can be formed in a substrate using ion implantation. As the size of photodiodes continue to get smaller for the purpose of increasing the number of pixels without increasing chip size, the area of a light receiving portion in an image sensor is also reduced. This results in a reduction in image quality.

Also, since the height of a stack does not reduce as much as the area of the light receiving portion reduces, the number of photons incident to the light receiving portion also decreases. This is due to diffraction of light sometimes called an Airy disk.

To address this limitation, a photodiode can be formed using amorphous silicon (Si), or readout circuitry can be formed in a silicon (Si) substrate using a method such as wafer-to-wafer bonding. Also, a photodiode can be formed on and/or over the readout circuitry (referred to as a three-dimensional (3D) image sensor). The photodiode can be connected with the readout circuitry through a metal interconnection.

In the related art, a contact plug that connects the readout circuitry and the photodiode causes a short in the photodiode.

Also, both the source and the drain of the transfer transistor are heavily doped with N-type impurities, leading to a charge sharing phenomenon. When the charge sharing phenomenon occurs, the sensitivity of an output image is reduced and an image error can be generated.

In addition, because a photo charge is not able to readily move between the photodiode and the readout circuitry, a dark current is generated and/or saturation and sensitivity is reduced.

BRIEF SUMMARY

Embodiments of the subject invention provide an image sensor that can inhibit a short at a contact plug connecting a readout circuitry and an image sensing device, and a method for manufacturing the same.

Embodiments also provide an image sensor where a charge sharing phenomenon can be inhibited while also increasing a fill factor, and a method for manufacturing the same.

Embodiments also provide an image sensor that can minimize a dark current source and inhibit saturation reduction and sensitivity degradation by forming a smooth transfer path of a photo charge between a photodiode and a readout circuitry, and a method for manufacturing the same.

In an embodiment, an image sensor can comprise: a readout circuitry on a first substrate; a first interlayer dielectric disposed on the first substrate; an interconnection in the first interlayer dielectric and electrically connected to the readout circuitry; a second interlayer dielectric on the interconnection; an image sensing device on the second interlayer dielectric, the image sensing device comprising a first conductive type layer and a second conductive type layer; a via hole passing through the image sensing device and the second interlayer dielectric; a contact plug in the via hole and electrically connecting the first conductive type layer to the interconnection; and a sidewall dielectric on a sidewall of the second conductive type layer within the via hole.

In another embodiment, an image sensor can comprise: a readout circuitry on a first substrate; an interconnection on the first substrate and electrically connected to the readout circuitry; an image sensing device on the interconnection, the image sensing device comprising a first conductive type layer and a second conductive type layer; and a contact plug electrically connecting the first conductive type layer of the image sensing device to the interconnection.

In yet another embodiment, a method for manufacturing an image sensor can comprise: forming a readout circuitry on a first substrate; forming an interconnection on the first substrate and electrically connected to the readout circuitry; forming an image sensing device on the interconnection, the image sensing device comprising a first conductive type layer and a second conductive type layer; and forming a contact plug electrically connecting the first conductive type layer of the image sensing device to the interconnection.

The details of one or more embodiments are set forth in the accompanying drawings and the detailed description below. Other features will be apparent to one skilled in the art from the detailed description, the drawings, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
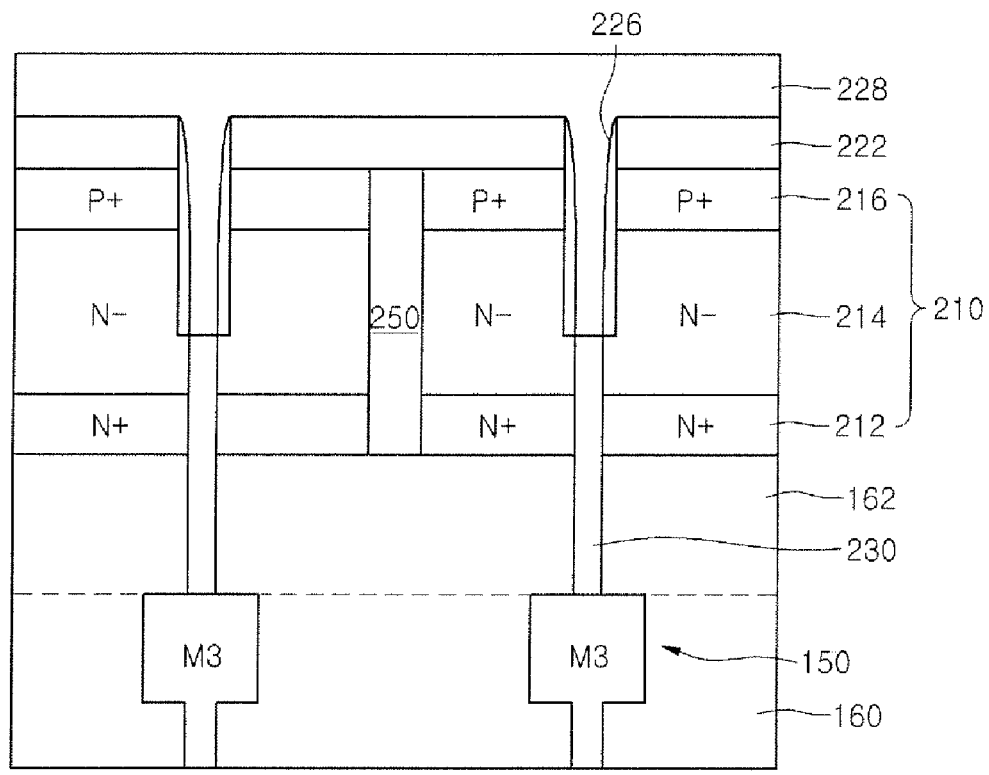
FIG. 1 is a cross-sectional view showing an image sensor according to an embodiment of the present invention.
Figure 3:
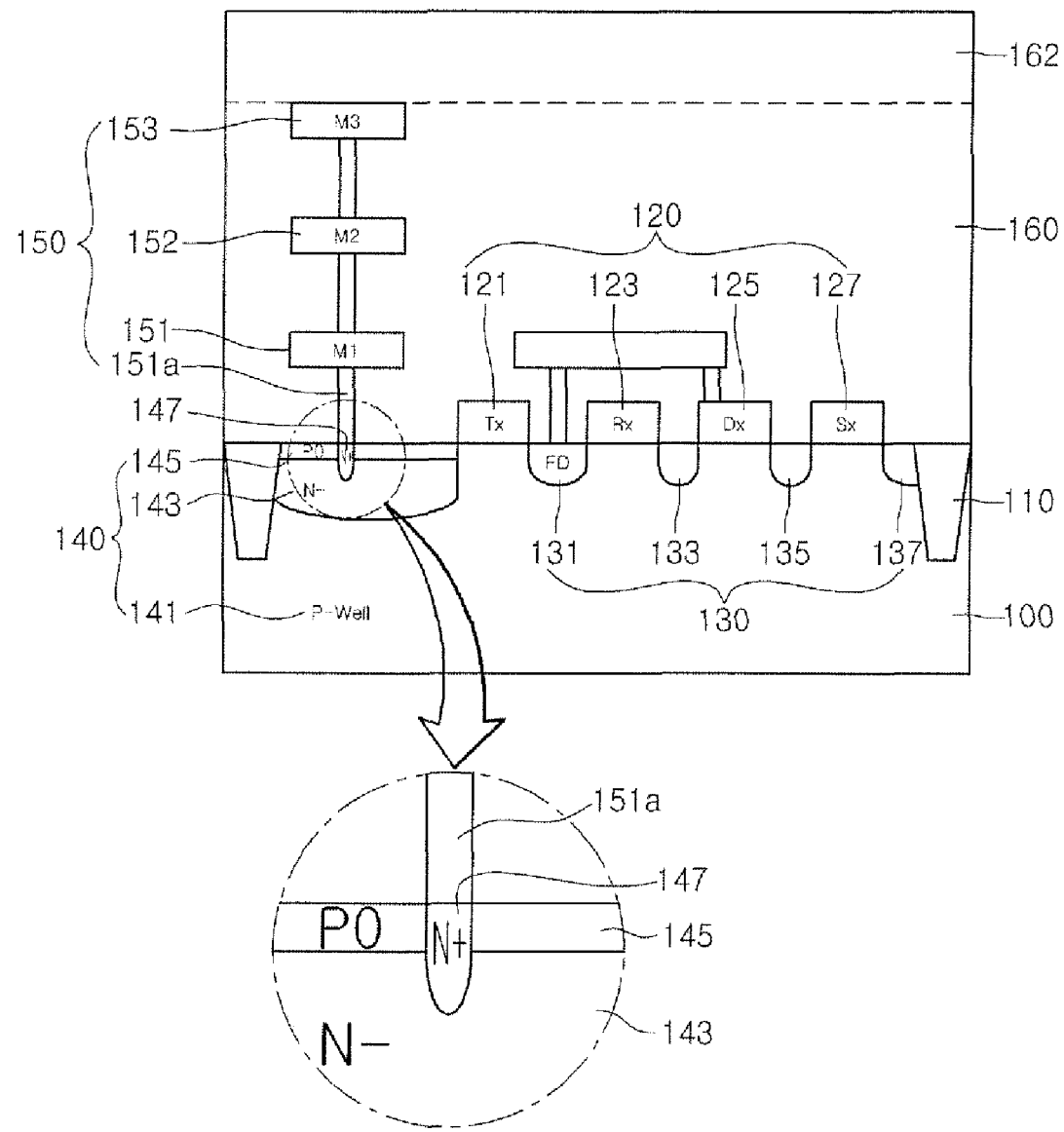

FIG. 1 is a cross-sectional view showing an image sensor according to an embodiment of the present invention. FIG. 3 shows a detailed cross-sectional view of a portion of an image sensor according to an embodiment of the present invention.

Referring to FIGS. 1 and 3, in an embodiment, an image sensor can include: a readout circuitry 120 at a first substrate 100 (as shown in FIG. 3); an interconnection 150 electrically connected to the readout circuitry 120 and disposed on the first substrate 100; an image sensing device 210 including a first conductive type first layer 212 and a second conductive type layer 216 on the interconnection 150; and a contact plug 230 electrically connecting the first conductive type layer 212 of the image sensing device 210 to the interconnection 150.

The image sensor can include: the readout circuitry 120 on the first substrate 100; the interconnection 150 electrically connected to the readout circuitry 120 and disposed in a first interlayer dielectric 160 disposed on the first substrate 100; a second interlayer dielectric 162 on the interconnection 150; the image sensing device 210 including the first conductive type first layer 212 and the second conductive type layer 216 on the second interlayer dielectric 162; the contact plug 230 connecting a first conductive type second layer 214 to the interconnection 150 through a via hole passing through the image sensing device 210; and a sidewall dielectric 226 on a sidewall of the second conductive type layer 216 within the via hole.

The image sensing device 210 can be a photodiode, though embodiments of the subject invention are not limited thereto. For example, the image sensing device 210 can be a photogate or a combination of a photodiode and a photogate. In one embodiment, the image sensing device 210 can be a photodiode formed in a crystalline semiconductor layer. In another embodiment, the image sensing device 210 can be a photodiode formed in an amorphous semiconductor layer.

Hereinafter, a method for manufacturing an image sensor according to an embodiment will be described with reference to FIGS. 2 to 12.

Figure 2:
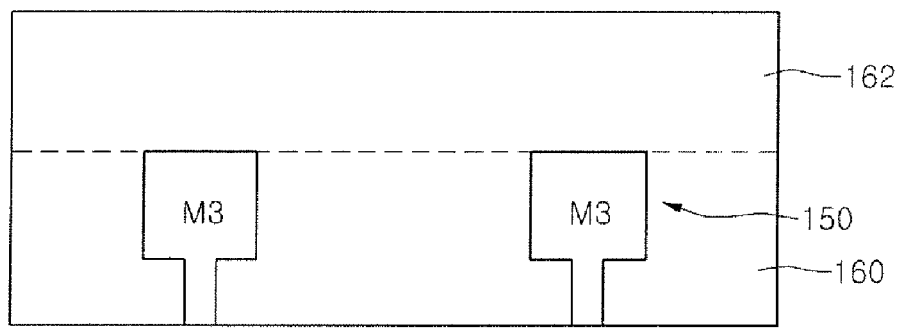
FIGS. 2 to 12 are cross-sectional views showing a method for manufacturing an image sensor according to an embodiment of the present invention.

FIG. 2 is a schematic view showing the first substrate 100 provided with the interconnection 150. FIG. 3 is a detailed view including some of the features of FIG. 2.

Referring to FIG. 3, an active region can be defined by forming a device isolation layer 110 in the first substrate 100. The readout circuitry 120 can include, for example, a transfer transistor (Tx) 121, a reset transistor (Rx) 123, a drive transistor (Dx) 125, and a select transistor (Sx) 127. An ion implantation region 130 can be formed. The ion implantation region 130 can include, for example, a floating diffusion region (FD) 131 and source/drain regions 133, 135, and 137 for the transistors.

In an embodiment, an electrical junction region 140 can be formed on the first substrate 100, and a first conductive type connection 147 can be formed connected to the interconnection 150 at an upper part of the electrical junction region 140.

For example, the electrical junction region 140 can be a P-N junction 140, though embodiments of the subject invention are not limited thereto. In an embodiment, the electrical junction region 140 can include a first conductive type ion implantation layer 143 formed on a second conductive type well 141 or a second conductive type epitaxial layer, and a second conductive type ion implantation layer 145 formed on the first conductive type ion implantation layer 143. For example, the electrical junction region 140 can be a P0 (145)/N− (143)/P− (141) junction, though embodiments of the subject invention are not limited thereto. The first substrate 100 can be a second conductive type substrate, though embodiments of the present invention are not limited thereto.

In an embodiment, the device can be designed to provide a potential difference between the source and drain of the transfer transistor (Tx), thereby enabling the full dumping of a photo charge. Accordingly, a photo charge generated in the photodiode can be dumped to the floating diffusion region, thereby increasing the output image sensitivity.

Specifically, electrons generated in the photodiode 210 can be transferred to the electrical junction region 140, and they can be transferred to the floating diffusion (FD) 131 node to be converted into a voltage when the transfer transistor (Tx) 121 is turned on.

The maximum voltage of the electrical junction region 140 (e.g., a P0/N−/P− junction) can become a pinning voltage, and the maximum voltage of the FD 131 node can become Vdd minus the threshold voltage (Vth) of the reset transistor (Rx). Therefore, due to a potential difference between the source and drain of the Tx 131, without charge sharing, electrons generated in the photodiode 210 on the chip can be completely dumped to the FD 131 node.

The first conductive type connection 147 can be formed between the photodiode and the readout circuit to create a smooth transfer path of a photo charge, thereby making it possible to minimize a dark current source and inhibit saturation reduction and sensitivity degradation.

To this end, in an embodiment, an N+ doping region can be formed as the first conductive type connection 147 for an ohmic contact on the surface of the electrical junction region 140 (e.g., a P0/N−/P− junction). The N+ region (147) can be formed such that it penetrates the P0 region (145) to contact the N− region (143).

In an embodiment, the width of the first conductive type connection 147 can be minimized to inhibit the first conductive type connection 147 from being a leakage source. To this end, a plug implant can be performed after etching a contact hole for a first metal contact 151a, though embodiments of the present invention are not limited thereto. For example, an ion implantation pattern (not shown) can be formed, and the ion implantation pattern can be used as an ion implantation mask when forming the first conductive type connection 147.

Next, the interlayer dielectric 160 can be formed on the first substrate 100, and the interconnection 150 can be formed. The interconnection 150 can include, for example, the first metal contact 151a, a first metal 151, a second metal 152, and a third metal 153, though embodiments of the subject invention are not limited thereto.

The second interlayer dielectric 162 can be formed on the interconnection 150. The second interlayer dielectric 162 can be formed of any suitable material known in the art; for example, a dielectric such as an oxide layer or a nitride layer. The second interlayer dielectric 162 can increase bonding force of a second substrate (not shown) provided with the first substrate 100 and the image sensing device 210.

Figure 4:
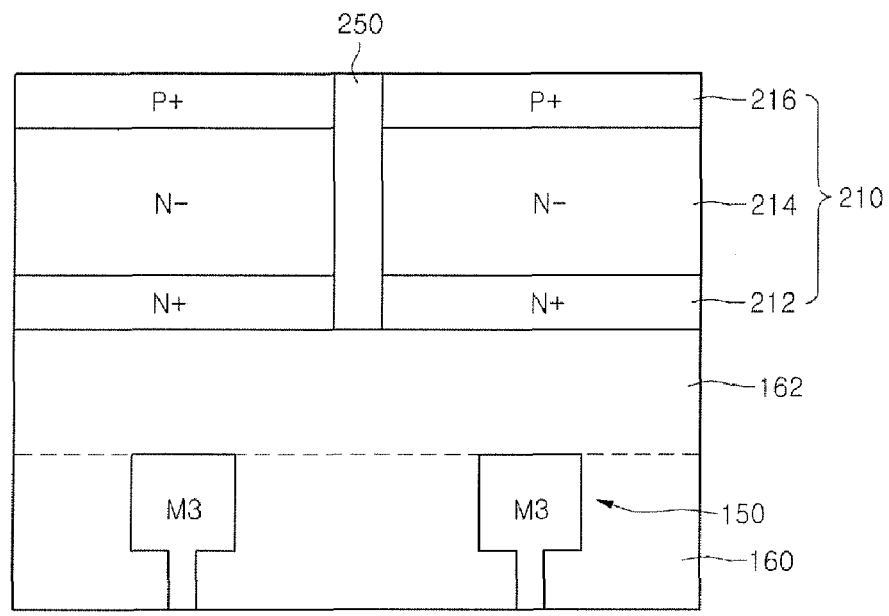

Referring to FIG. 4, the image sensing device 210 including the first conductive type second layer 214 and the second conductive type layer 216 can be formed on the second interlayer dielectric 162.

For example, a crystalline semiconductor layer of a second substrate can be provided with a photodiode including an N− layer (a first conductive type second layer 214) and a P+ layer (a second conductive type layer 216). An N+ layer (a first conductive type first layer 212) can also be provided for an ohmic contact. In an embodiment, the thickness of the first conductive type second layer 214 can be greater than that of the second conductive type layer 216, so as to increase charge storing capacity. For example, the thickness of the N− layer (214) can be increased to expand its area, thus increasing capacity for storing photoelectrons.

Then, an etching process, dividing the image sensing device 210 by pixel, can be performed to fill etched portions between pixels with an inter-pixel separation layer 250. The inter-pixel separation layer 250 can be formed, for example, through an ion implantation process or using a dielectric. In an embodiment, the inter-pixel separation layer 250 can be formed after forming the contact plug 230.

Figure 5:
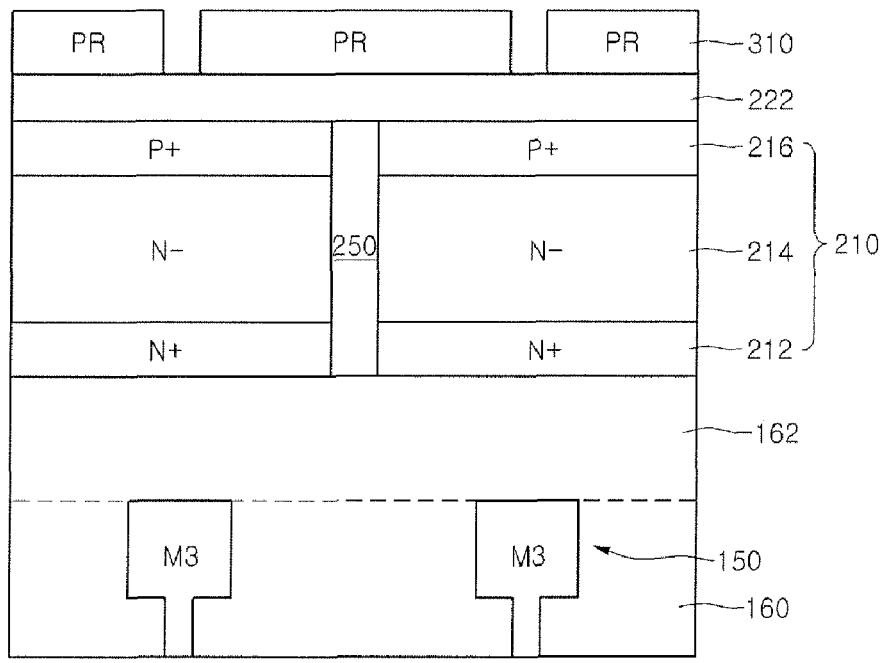

Referring to FIG. 5, a first dielectric 222 can be formed on the image sensing device 210, and a photoresist pattern 310 for forming first via holes can be formed. The first dielectric 222 can be, for example, an oxide layer or a nitride layer, though embodiments of the present invention are not limited thereto.

Figure 6:
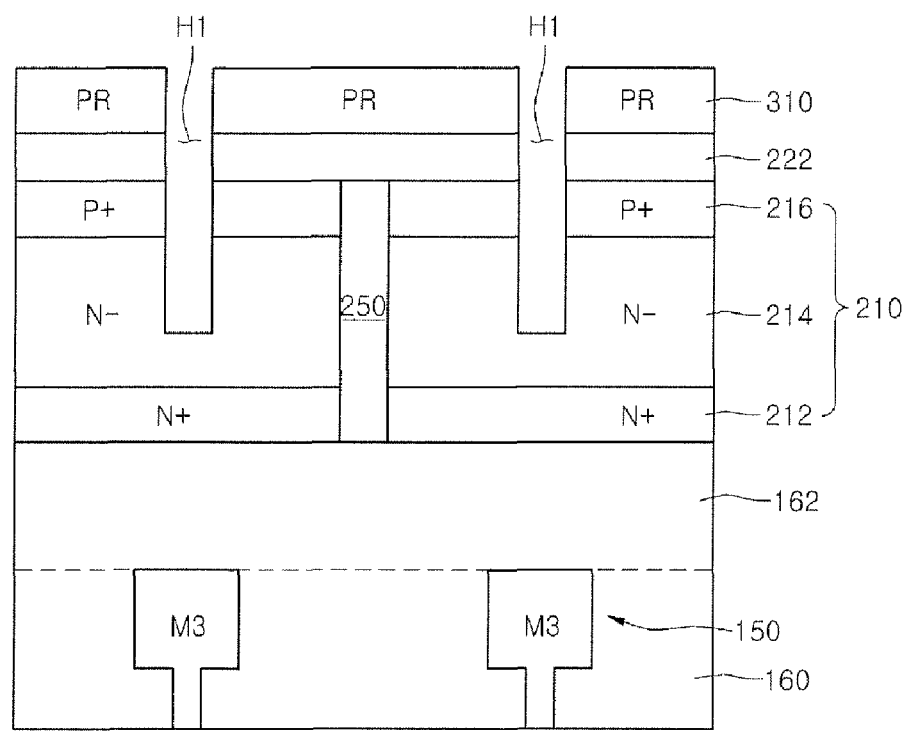

Referring to FIG. 6, first via holes H1 can be formed by partially removing the second conductive type layer 216 of the image sensing device 210. The first via holes H1 can be formed by partially removing the second conductive type layer using the photoresist pattern 310 as an etch mask, so as to expose a portion of the first conductive type second layer 214. The first via holes H1 are not deep enough to expose the first conductive type first layer 212 below the first conductive type second layer 214. For example, the first via holes H1 can be formed by partially removing a P+ layer (216) using the photoresist pattern 310 as an etch mask, so as to expose an N− layer (214). The first via holes H1 can be deep enough to pass through the second conductive type layer 216, but not deep enough to reach the first conductive type first layer 212 having high concentration.

Figure 7:
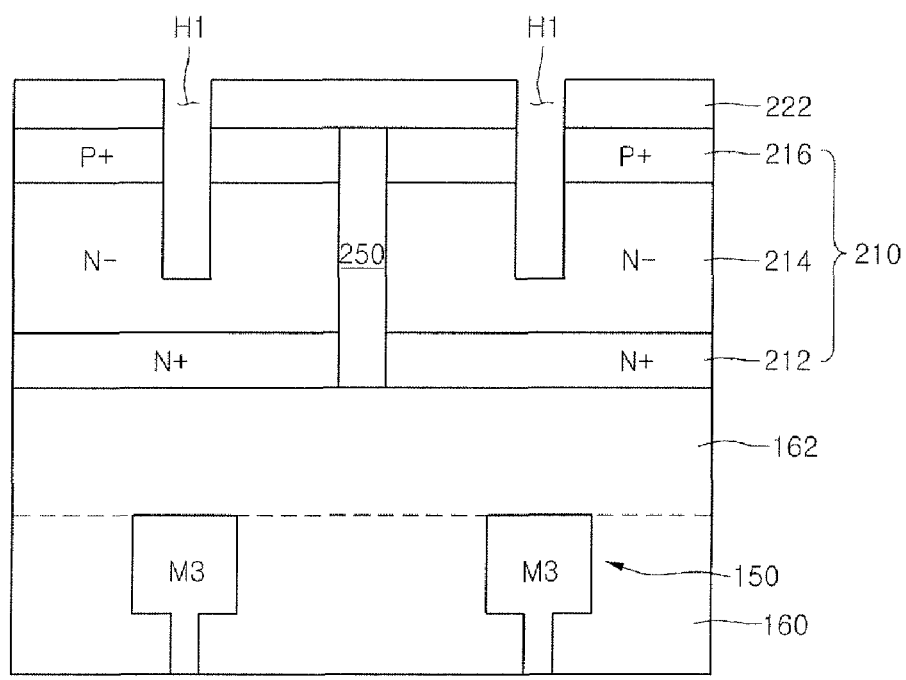

Referring to FIG. 7, the photoresist pattern 310 can be removed.

Figure 8:
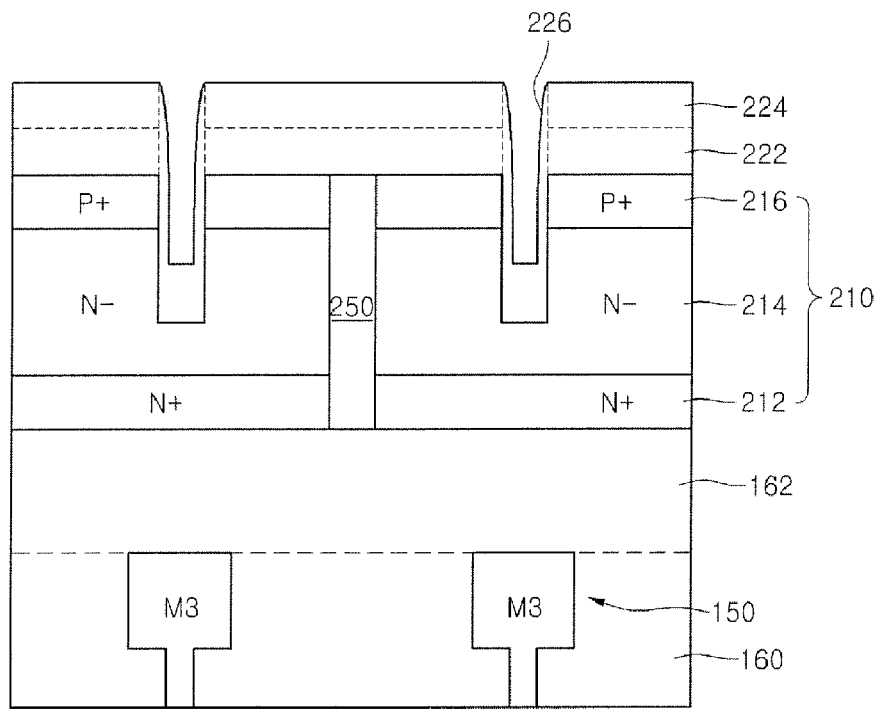

Referring to FIG. 8, the sidewall dielectric 226 can be formed on the sidewall of the second conductive type layer 216. The sidewall dielectric can also be formed on a portion of the sidewall of the first conductive type second layer 214. For example, a second dielectric 224 can be formed in the first via holes H1. The second dielectric 224 can be an oxide layer, though embodiments of the present invention are not limited thereto. Then, a blanket etch, such as an etch back, can be performed on the second dielectric 224 to form the sidewall dielectric 226 on the sidewall of the second conductive type layer 216.

In an embodiment, the contact plug 230 passing through the image sensing device 210 can be insulated using the sidewall dielectric 226 to inhibit the occurrence of a short at the contact plug 230 connecting the readout circuitry 120 and the image sensing device 210.

Figure 9:
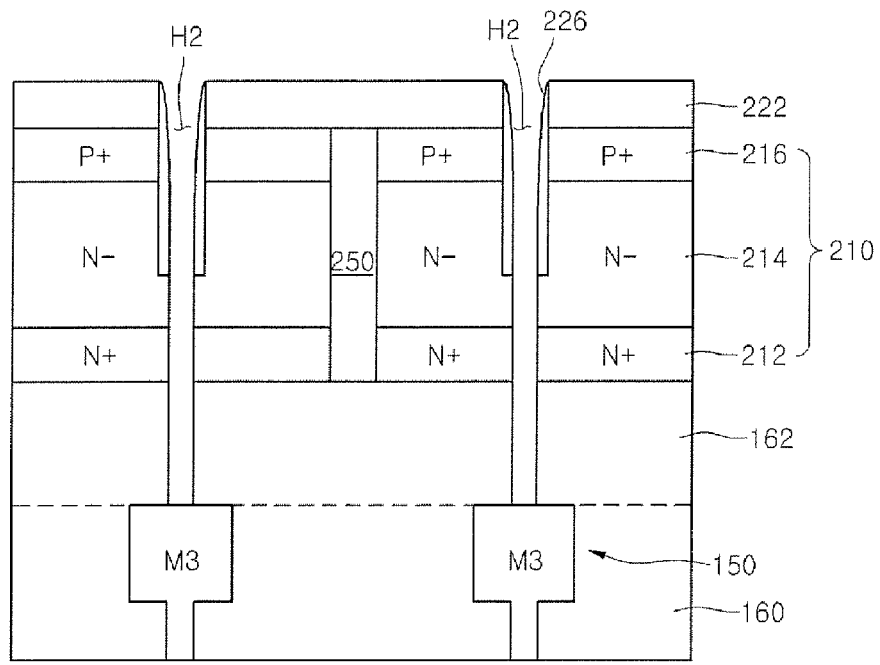

Referring to FIG. 9, second via holes H2, at least partially in line with the first via holes H1 can be formed to expose the interconnection 150. The second via holes H2 can be formed using the sidewall dielectric 226 as an etch mask. For example, the second via holes H2 can pass through the image sensing device 210 and the second interlayer dielectric 162 to expose an upper portion of the interconnection 150.

Figure 10:
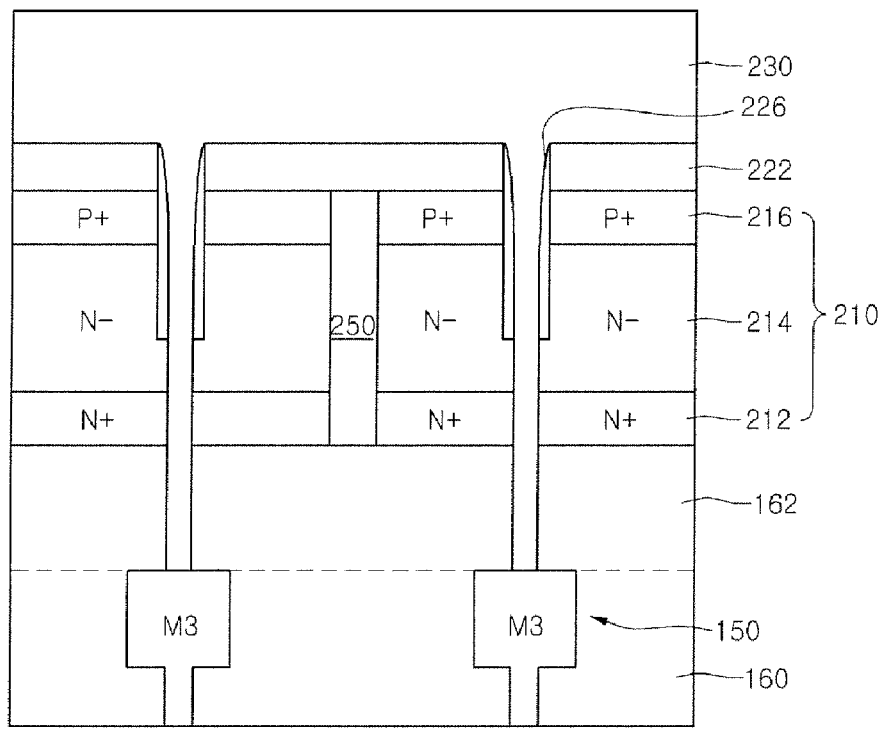

Referring to FIG. 10, the contact plug 230, connecting the first conductive type second layer 214 and the interconnection 150, can be formed in the second via holes H2. The contact plug 230 filling the second via holes H2 can be formed of, for example, metal such as tungsten (W) and/or titanium (Ti).

Figure 11:
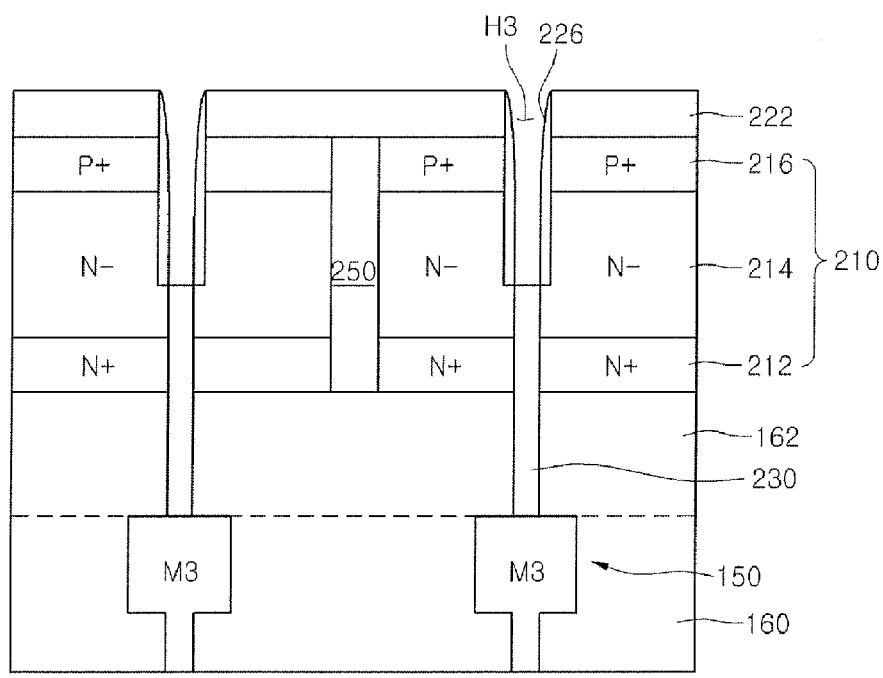

Referring to FIG. 11, a portion of the contact plug 230 can be removed to form third via holes H3. For example, a portion of the contact plug 230 can be removed such that an upper surface of the contact plug 230 is lower than a lower surface of the second conductive type layer 216. For example, a portion of the contact plug 230 can be removed through a blanket etch.

Figure 12:
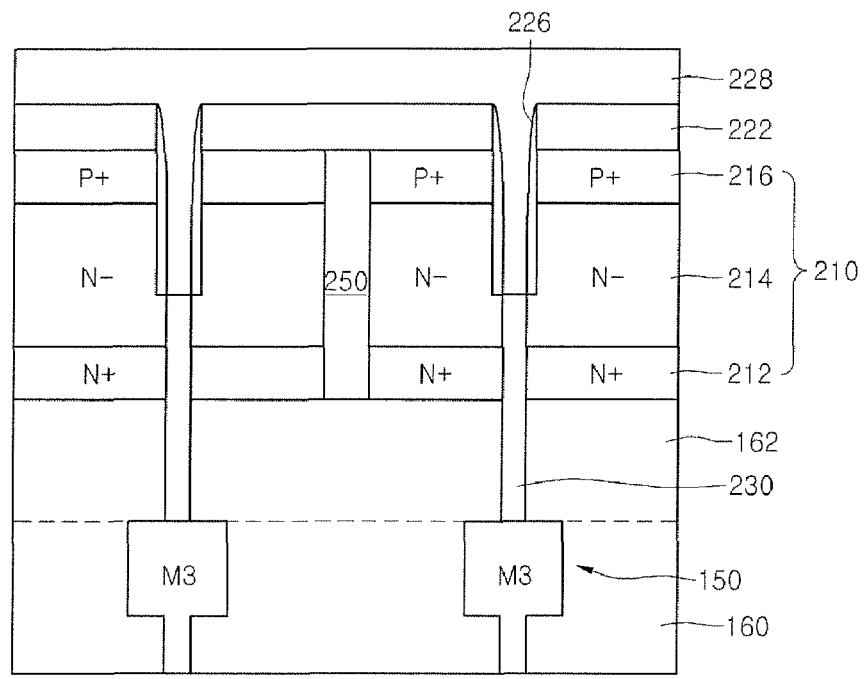

Referring to FIG. 12, a third dielectric 228 can be formed in the third via holes H3. The third dielectric 228 can be any suitable material known in the art, for example, an oxide layer.

Then, a ground process can be performed on the second conductive type layer 216.

According to embodiments of the present invention, the contact plug 230 passing through the image sensing device 210 can be insulated using the sidewall dielectric 226 to avoid a short at the contact plug 230 connecting the readout circuitry 120 and the image sensing device 210.

Figure 13:
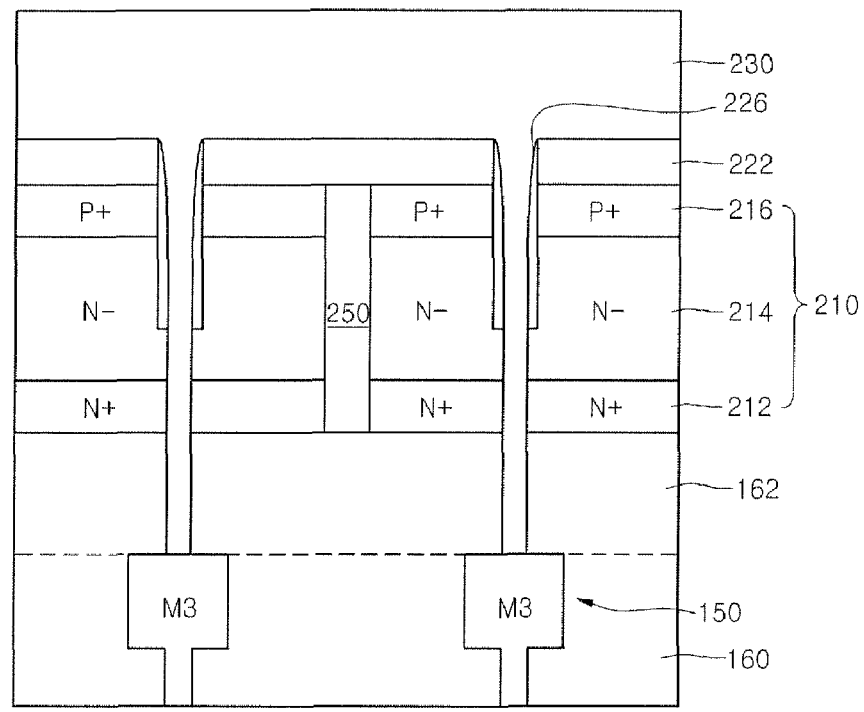
FIGS. 13 to 14 are cross-sectional views showing a method for manufacturing an image sensor according to an embodiment of the present invention.
Figure 14:
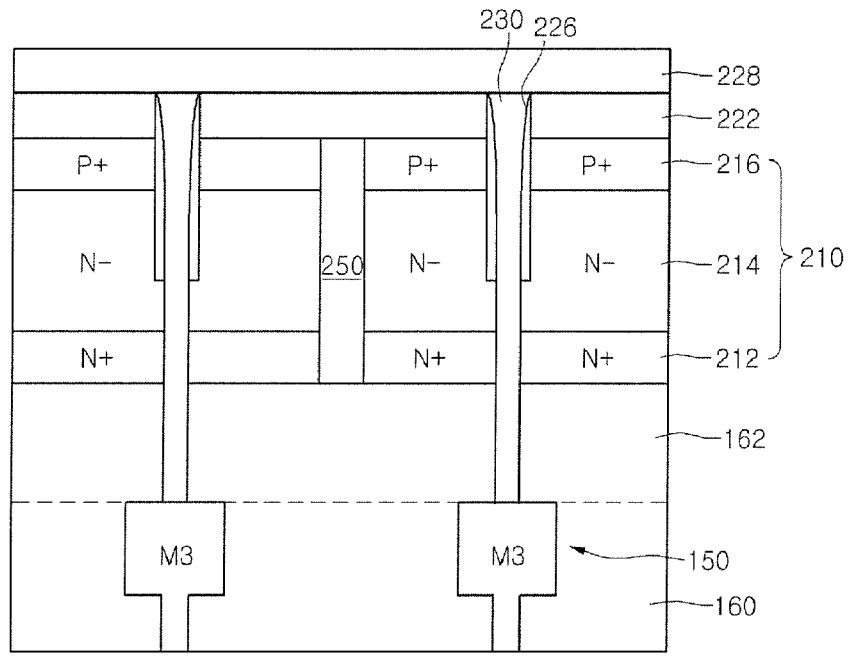

FIGS. 13 and 14 are cross-sectional views illustrating a method for manufacturing an image sensor according to an embodiment of the present invention.

Referring to FIG. 13, the contact plug 230 can be formed in the first via holes H1.

Referring to FIG. 14, in an embodiment, a portion of the contact plug 230 can be removed such that an upper surface of the contact plug 230 is approximately even with an upper surface of the first dielectric 222 and/or an upper surface of the sidewall dielectric 226 (and is higher than an upper surface of the second conductive type layer 216). Then, the third dielectric 228 can be formed on the contact plug 230, and a ground process can be performed on the second conductive type layer 216.

According to this embodiment, the contact plug 230 can be electrically insulated from the second conductive type layer 216 through the sidewall dielectric 226. Thus, even when only the portion of the contact plug 230 extending above the image sensing device 210 is removed, a short can be avoided and manufacturing efficiency can be improved.

Figure 15:
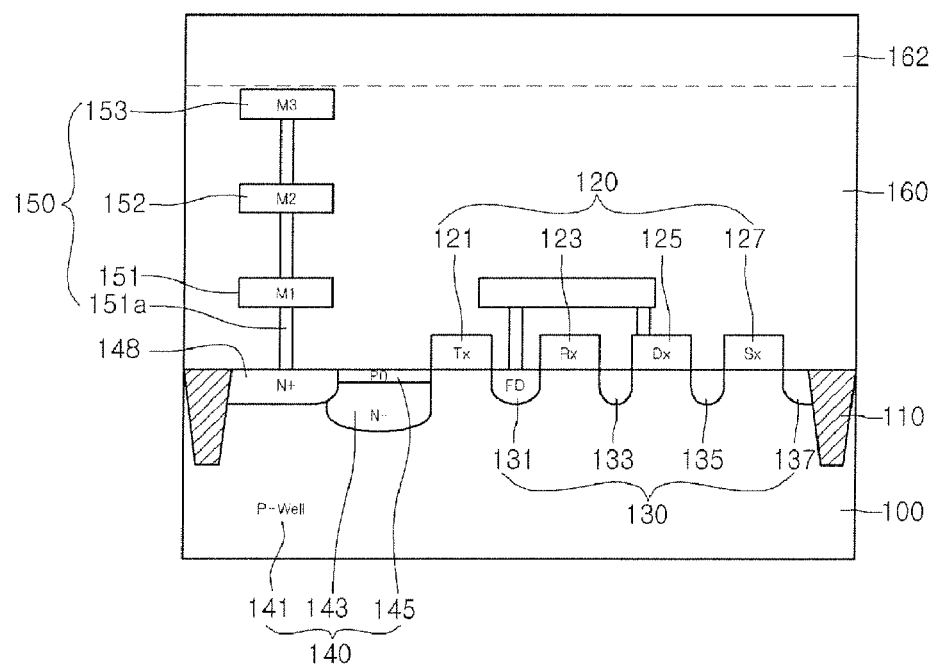
FIG. 15 is a cross-sectional view showing an image sensor according to an embodiment of the present invention.

FIG. 15 is a cross-sectional view illustrating an image sensor according to an embodiment of the present invention. The first substrate 100 provided with the interconnection 150 is shown in detail.

Referring to FIG. 15, in an embodiment, a first conductive type connection 148 can be disposed at a side of (and electrically connected to) the electrical junction region 140.

For example, the first conductive type connection 148 can be an N+ connection region and can be formed at a side of the electrical junction region 140 (e.g., a P0/N−/P− junction) for an ohmic contact. In this case, a leakage source can sometimes be generated during the formation process of the N+ connection region 148 and the first metal contact 151a. Also, when the N+ connection region 148 is formed over the surface of the P0/N−/P− junction 140, an electric field can also be generated due to the N+/P0 junction 148/145. This electric field can also become a leakage source.

Accordingly, in an embodiment of the present invention, a layout is provided in which the first contact plug 151a can be formed in an active region not doped with a P0 layer, but rather includes the N+ connection region 148 that is electrically connected to the N− layer 143.

According to this embodiment, the electric field may not be generated on and/or over an Si surface, and this embodiment can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
a readout circuitry on a first substrate;
a first interlayer dielectric disposed on the first substrate;
an interconnection in the first interlayer dielectric and electrically connected to the readout circuitry;
a second interlayer dielectric on the interconnection;
an image sensing device including a photodiode directly disposed on an upper surface of the second interlayer dielectric, the photodiode comprising a first conductive type layer over the second interlayer dielectric and a second conductive type layer on the first conductive type layer;
a via hole passing through the image sensing device and the second interlayer dielectric;
a contact plug in the via hole and electrically connecting the first conductive type layer to the interconnection; and
a sidewall dielectric on a sidewall of the second conductive type layer within the via hole,
wherein the photodiode is formed over the first substrate, and
wherein the second interlayer dielectric intervenes between the first substrate and the photodiode.

2. The image sensor according to claim 1, further comprising a third dielectric in the via hole and on the sidewall dielectric,
wherein the contact plug is in contact with the first conductive type layer.

3. The image sensor according to claim 1, wherein the sidewall dielectric is disposed between the contact plug and the second conductive type layer, and wherein an upper surface of the contact plug is higher than an upper surface of the second conductive type layer.

4. The image sensor according to claim 3, further comprising a third dielectric on the contact plug.

5. The image sensor according to claim 1, further comprising an electrical junction region electrically connected to the readout circuitry on the first substrate,
wherein the electrical junction region comprises:
a first conductive type ion implantation region on the first substrate; and
a second conductive type ion implantation region on the first conductive type ion implantation region.

6. The image sensor according to claim 5, wherein the readout circuitry comprises at least one transistor having a source and a drain, and wherein the readout circuitry has a potential difference between the source and the drain of the at least one transistor.

7. The image sensor according to claim 5, further comprising a first conductive type connection between the electrical junction region and the interconnection,
wherein the first conductive type connection is disposed on the electrical junction region and is electrically connected to the interconnection.

8. The image sensor according to claim 5, further comprising a first conductive type connection between the electrical junction region and the interconnection,
wherein the first conductive type connection is disposed at a side of the electrical junction region and is electrically connected to the interconnection.

9. The image sensor according to claim 1, further comprising an inter-pixel separation layer comprising ions in the image sensing device to divide the image sensing device by pixel.

10. The image sensor according to claim 1, further comprising an inter-pixel separation layer comprising a dielectric filling etched portions between pixels to divide the image sensing device by pixel.

* * * * *